(12) United States Patent
Wakabayashi et al.

(10) Patent No.: US 7,075,181 B2
(45) Date of Patent: Jul. 11, 2006

(54) SEMICONDUCTOR PACKAGE HAVING SEMICONDUCTOR CONSTRUCTING BODY AND METHOD OF MANUFACTURING THE SAME

(75) Inventors: Takeshi Wakabayashi, Sayama (JP); Shinji Wakisaka, Hanno (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 10/851,880

(22) Filed: May 20, 2004

(65) Prior Publication Data

US 2005/0019982 A1    Jan. 27, 2005

(30) Foreign Application Priority Data

May 21, 2003    (JP) ............................ 2003-142830

(51) Int. Cl.
*H01L 21/302* (2006.01)

(52) U.S. Cl. .................. 257/734; 257/690; 438/614
(58) Field of Classification Search ........ 438/106–118, 438/611–616; 257/690, 693, 734–737, 750, 257/762
See application file for complete search history.

(56) References Cited

U.S. PATENT DOCUMENTS

| 5,672,542 | A  | * | 9/1997  | Schwiebert et al. ........... 438/4 |
| 6,559,527 | B1 | * | 5/2003  | Brofman et al. ............. 257/678 |
| 6,770,971 | B1 | * | 8/2004  | Kouno et al. ................ 257/734 |
| 2003/0096454 | A1 | * | 5/2003 | Poo et al. ................... 438/109 |
| 2004/0070064 | A1 | * | 4/2004 | Yamane et al. ............. 257/686 |
| 2004/0195686 | A1 | * | 10/2004 | Jobetto et al. ............. 257/734 |
| 2005/0098891 | A1 | * | 5/2005 | Wakabayashi et al. ...... 257/758 |

FOREIGN PATENT DOCUMENTS

JP    2000-195890 A    7/2000

* cited by examiner

*Primary Examiner*—David Nelms
*Assistant Examiner*—Calvin Lee
(74) *Attorney, Agent, or Firm*—Frishauf, Holtz, Goodman & Chick, P.C.

(57) ABSTRACT

A semiconductor package includes at least one semiconductor constructing body which has a semiconductor substrate and a plurality of external connection electrodes formed thereon. An insulating film covers the semiconductor constructing body. Each of interconnections which has a projecting electrode is formed on the insulating film. The projecting electrodes of the interconnection cut through the insulating film at portions corresponding to the external connection electrodes and electrically connected to the external connection electrodes.

32 Claims, 22 Drawing Sheets

US 7,075,181 B2

SEMICONDUCTOR PACKAGE HAVING SEMICONDUCTOR CONSTRUCTING BODY AND METHOD OF MANUFACTURING THE SAME

CROSS-REFERENCE TO RELATED APPLICATIONS

This application is based upon and claims the benefit of priority from prior Japanese Patent Application No. 2003-142830, filed May 21, 2003, the entire contents of which are incorporated herein by reference.

BACKGROUND OF THE INVENTION

1. Field of the Invention

The present invention relates to a semiconductor package having a semiconductor constructing body and a method of manufacturing the same.

2. Description of the Related Art

There is conventionally a semiconductor package called a CSP (Chip Size Package). In the CSP, an insulating film is formed on the upper surface of a semiconductor substrate having a plurality of connection pads for external connection. Opening portions are formed in the insulating film in correspondence with the respective connection pads. Interconnections are formed from the upper surfaces of the connection pads exposed through the opening portions to predetermined positions on the upper surface of the insulating film (e.g., Jpn. Pat. Appln. KOKAI Publication No. 2000-195890). In this case, an underlying metal layer is formed on the entire upper surface of the insulating film, including the upper surfaces of the connection pads exposed through the opening portions. Interconnections are formed at predetermined positions on the upper surface of the underlying metal layer by copper electroplating using the underlying metal layer as a plating current path. Unnecessary portions of the underlying metal layer are then removed by etching using the interconnections as a mask so that the underlying metal layer is left only under the interconnections.

In the conventional semiconductor package, as described above, the opening portions are formed in the insulating film in correspondence with the connection pads. The underlying metal layer serving as a plating current path is formed by sputtering or electroless plating, and the interconnections are formed by electroplating. For this reason, the bonding strength between the insulating film and the underlying metal layer is low. In this structure, especially, disconnection readily occurs on the sidewalls of the opening portions. In addition, the reliability of electrical connection between the connection pads and the interconnections is poor.

BRIEF SUMMARY OF THE INVENTION

It is an object of the present invention to provide a semiconductor package capable of increasing the reliability of electrical connection between an external connection electrode and an interconnection, and a method of manufacturing the semiconductor package.

According to the present invention, there is provided a semiconductor package comprising at least one semiconductor constructing body which is formed on a semiconductor substrate and has a plurality of external connection electrodes, an insulating film which covers the semiconductor constructing body, and interconnections each of which has a projecting electrode and is formed on the insulating film, wherein the projecting electrodes of the interconnection cut into the insulating film at portions corresponding to the external connection electrodes and are connected to the external connection electrodes.

According to the present invention, there is also provided a method of manufacturing a semiconductor package, comprising covering, with an insulating film, an upper surface of a semiconductor constructing body having a plurality of external connection electrodes; arranging, on the insulating film, a metal plate having projecting electrodes corresponding to the external connection electrodes; making the projecting electrodes of the metal plate cut into the insulating film and connecting the projecting electrodes to the external connection electrodes; and forming interconnections by patterning the metal plate.

According to the present invention, projecting electrodes are formed on interconnections made of a metal plate. The projecting electrodes are made to cut into the insulating film formed on external connection electrodes. In this state, the projecting electrodes are connected to the external connection electrodes. Hence, the bonding strength between the projecting electrodes and the insulating film increases. Accordingly, the reliability of electrical connection between the interconnections and the external connection electrodes increases.

DETAILED DESCRIPTION OF THE INVENTION

Figure 1:
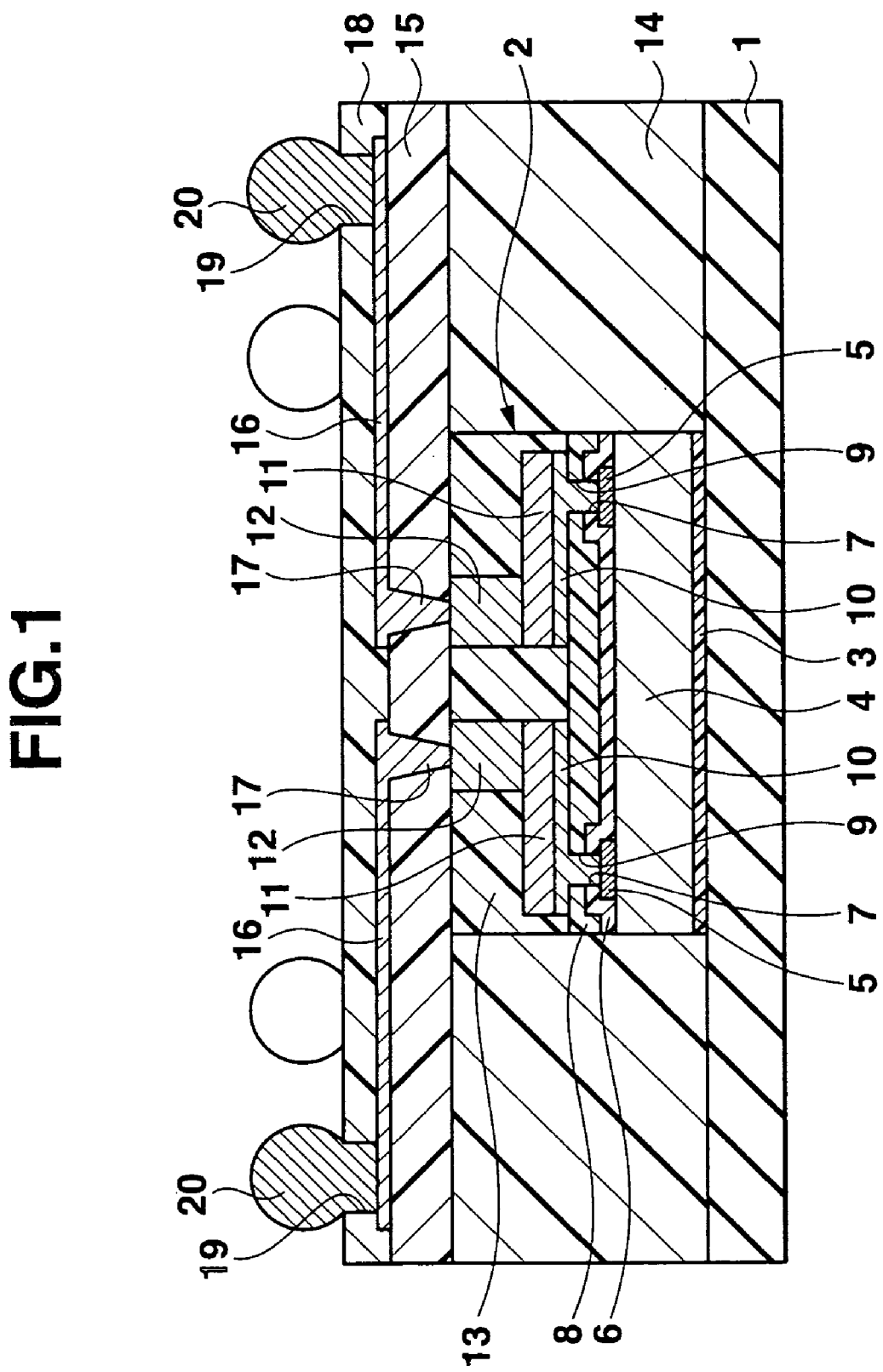
FIG. 1 is an enlarged sectional view of a semiconductor-package according to the first embodiment of the present invention.

FIG. 1 is a sectional view of a semiconductor package according to an embodiment of the present invention. This semiconductor package comprises a base plate 1 having a rectangular planar shape and made of silicon, glass, ceramic, a resin, or a metal.

The lower surface of a semiconductor constructing body 2 which has a rectangular planar shape and is slightly smaller than the base plate 1 is bonded to the central portion of the upper surface of the base plate 1 via an adhesive layer 3 made of a die bonding material. In this case, the semiconductor constructing body 2 has interconnections, columnar electrodes, and a sealing film (to be described later) and is generally called a CSP. The semiconductor constructing body 2 is also particularly called a wafer-level CSP (W-CSP) because a method of forming the interconnections, columnar electrodes, and sealing film on a silicon wafer and then executing dicing to obtain individual semiconductor constructing bodies 2 is employed, as will be described later. The structure of the semiconductor constructing body 2 will be described below.

The semiconductor constructing body 2 has a silicon substrate (semiconductor substrate) 4. The silicon substrate 4 is bonded to the base plate 1 via the adhesive layer 3. An integrated circuit (not shown) is formed at the central portion of the upper surface of the silicon substrate 4. A plurality of connection pads 5 are formed at the peripheral portion of the integrated circuit on the upper surface of the silicon substrate 4. The connection pads 5 are made of an aluminum-based metal and connected to the integrated circuit elements that form the integrated circuit. An insulating film 6 made of an inorganic material such as silicon oxide is formed on the upper surfaces of the silicon substrate 4 and connection pads 5 except the central portion of each connection pad 5. The central portion of each connection pad 5 is exposed through an opening portion 7 formed in the insulating film 6.

A protective film (insulating film) 8 made of an organic resin material such as epoxy resin or polyimide resin is formed on the upper surface of the insulating film 6. In this case, opening portions 9 are formed in the protective film 8 at positions corresponding to the opening portions 7 of the insulating film 6. An underlying metal layer 10 extending toward the center of the silicon substrate 4 is formed on the upper surface of the protective film 8, including the upper surface of each connection pad 5 exposed through the opening portions 7 and 9. Interconnections 11 made of copper are formed on the entire upper surface of the underlying metal layer 10.

A columnar electrode (external connection electrode) 12 made of copper is formed on the upper surface of the connection pad portion of each interconnection 11. A sealing film (insulating film) 13 made of a thermosetting resin material such as epoxy resin or polyimide resin is formed on the upper surfaces of the protective film 8 and the interconnections 11. The upper surface of the sealing film 13 is flush with those of the columnar electrodes 12. As described above, the semiconductor constructing body 2 called a W-CSP includes the silicon substrate 4, connection pads 5, and insulating film 6, and also includes the protective film 8, interconnections 11, columnar electrodes 12, and sealing film 13.

An insulating layer 14 having a rectangular frame shape and made of epoxy resin or polyimide resin is formed on the upper surface of the base plate 1 around the semiconductor constructing body 2. The upper surface of the insulating layer 14 is almost flush with that of the semiconductor constructing body 2. An insulating film 15 having a flat upper surface is formed on the upper surfaces of the semiconductor constructing body 2 and insulating layer 14. The insulating film 15 is made of, e.g., a thermosetting resin material which is prepared by heating and setting a prepreg material formed by impregnating glass fibers with epoxy resin.

Upper interconnections 16 are formed on the upper surface of the insulating film 15 by patterning a metal plate made of a copper-based metal material. In this case, under the lower surfaces of the upper interconnections 16, projecting electrodes 17 having a truncated conical shape are integrally formed at portions corresponding to the central portions of the upper surfaces of the columnar electrodes 12. The projecting electrodes 17 are pressed against the central portions of the upper surfaces of the columnar electrodes 12 while cutting or projecting into and through the insulating film 15.

An upper insulating film 18 made of a solder resist is formed on the upper surfaces of the insulating film 15 and the upper interconnections 16. Opening portions 19 are formed in the upper insulating film 18 at portions corresponding to the connection pad portions of the upper interconnections 16. Solder balls 20 are formed in the opening portions 19 to upwardly extend therefrom and connected to the connection pad portions of the upper interconnections 16 at their lower surface. The plurality of solder balls 20 are arranged in a matrix on the upper insulating film 18.

As described above, the size of the base plate 1 is larger than that of the semiconductor constructing body 2 to some extent. The reason for this is as follows. The arrangement region of the solder balls 20 is made larger than the size of the semiconductor constructing body 2 to some extent as the number of connection pads 5 on the silicon substrate 4 increases. Accordingly, the size and pitch of the connection pad portions of the upper interconnections 16 (the portions in the opening portions 19 of the upper insulating film 18) are made larger than those of the columnar electrodes 12.

Hence, the connection pad portions of the upper interconnections 16 arranged in a matrix are arranged not only on a region corresponding to the semiconductor constructing body 2 but also on a region corresponding to the insulating layer 14 arranged outside the outer side surface of the semiconductor constructing body 2. That is, of the solder balls 20 arranged in a matrix, at least the solder balls 20 at the outermost positions are arranged around the area corresponding to the semiconductor constructing body 2, that is, arranged on the peripheral area.

As described above, as a characteristic feature of this semiconductor package, the insulating layer 14 and insulating film 15 are formed around and on the semiconductor constructing body 2 in which not only the connection pads 5 and insulating film 6 but also the protective film 8, interconnections 11, columnar electrodes 12, and sealing film 13 are formed on the silicon substrate 4. The upper interconnections 16 are formed on the upper surface of the insulating film 15 by patterning a metal plate and connected to the columnar electrodes 12 by the projecting electrodes 17, 16 extended through the insulating film 15.

In this case, the upper surface of the insulating film 15 is flat. For this reason, the height level of the upper surfaces of the upper interconnections 16 and solder balls 20, which are formed in subsequent steps, can be uniformed, and the reliability of bonding can be increased, as will be described later. In addition, the thicknesses of the upper interconnections 16 formed by patterning a metal plate can be made uniform, and any step difference between the upper interconnections 16 can be prevented, as will be described later. In the semiconductor constructing body 2, the integrated circuit is covered with the protective film 8. In addition, the entire surface of the protective film 8 including the upper surfaces of the interconnections 11 formed on the protective film 8, except the portions where the columnar electrodes 12 are formed, is covered or sealed by the sealing film 13. With this structure, a KGD (Known Good Die) structure is obtained so that absolute reliability can be ensured against internal damage in stock and transport. For this reason, when the semiconductor constructing body 2 as the KGD structure is buried to form a semiconductor package, the semiconductor constructing body 2 rarely breaks down, and a very reliable semiconductor package can be obtained, as will be described below.

Figure 2:
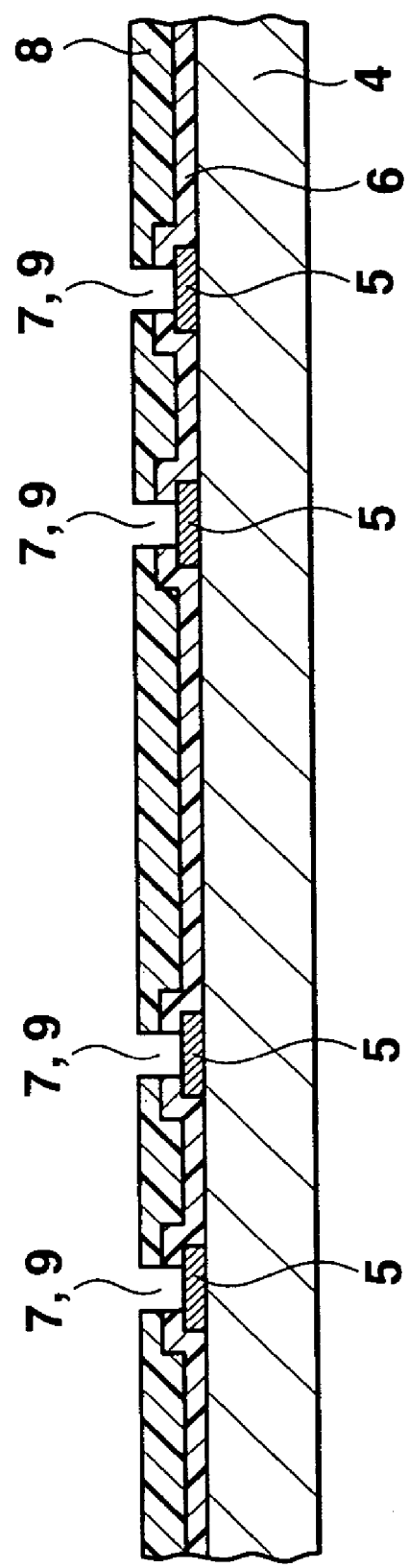
FIG. 2 is an enlarged sectional view of an initially prepared structure in an example of a method of manufacturing the semiconductor package shown in FIG. 1.

An example of a method of manufacturing the semiconductor package will be described next. First, an example of a method of manufacturing the semiconductor constructing body 2 will be described. In this case, as shown in FIG. 2, a structure is prepared, in which the connection pads 5 made of an aluminum-based metal, the insulating film 6 made of silicon oxide, which are covered by the protective film 8 made of epoxy resin or polyimide resin, are formed on the silicon substrate (semiconductor substrate) 4 in a wafer state, and the central portions of the connection pads 5 are exposed through opening portions 7 and 9 respectively formed in the insulating film 6 and protective film 8. In the above structure, integrated circuits having a predetermined function are formed in respective regions of the silicon substrate 4 in the wafer state, where semiconductor constructing bodies should be formed. Each connection pad 5 is electrically connected to the integrated circuit formed in the corresponding region.

Figure 3:
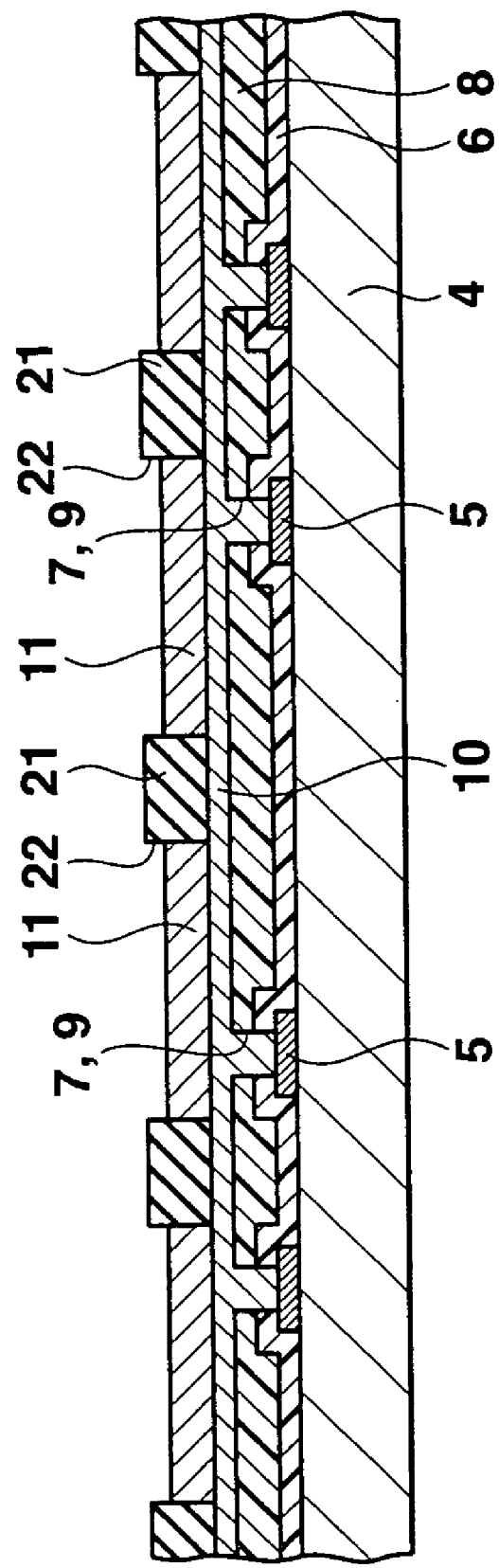
FIG. 3 is an enlarged sectional view showing a step following FIG. 2.

Next, as shown in FIG. 3, the underlying metal layer 10 is formed on the entire upper surface of the protective film 8, including the upper surfaces of the connection pads 5 exposed through the opening portions 7 and 9. In this case, the underlying metal layer 10 may have only a copper layer formed by electroless plating or sputtering. Alternatively, the metal layer 10 may be constructed by a copper layer formed by sputtering on a thin titanium layer formed by sputtering.

Next, a plating resist film 21 is formed and then patterned on the upper surface of the underlying metal layer 10. In this case, the plating resist film 21 has an opening portion 22 at a position corresponding to the formation region of each interconnection 11. Copper electroplating is executed using the underlying metal layer 10 as a plating current path to form the interconnection 11 on the upper surface of the underlying metal layer 10 in each opening portion 22 of the plating resist film 21. Then, the plating resist film 21 is removed.

Figure 4:
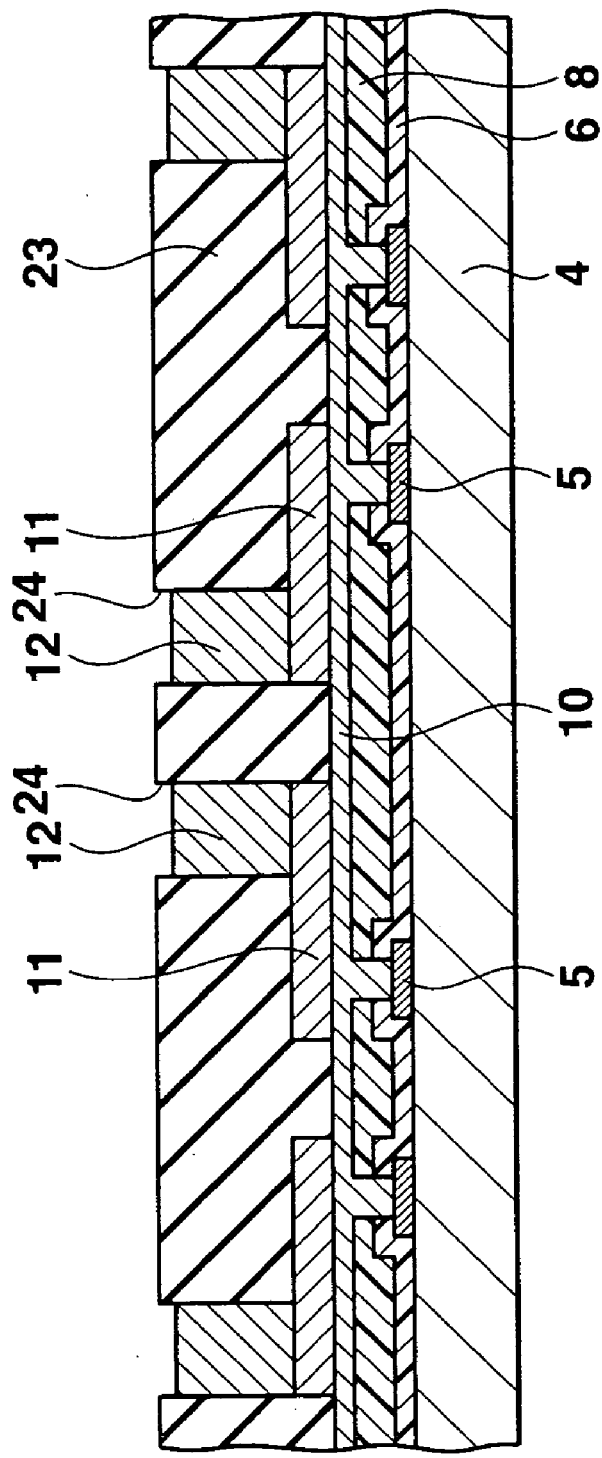
FIG. 4 is an enlarged sectional view showing a step following FIG. 3.
Figure 5:
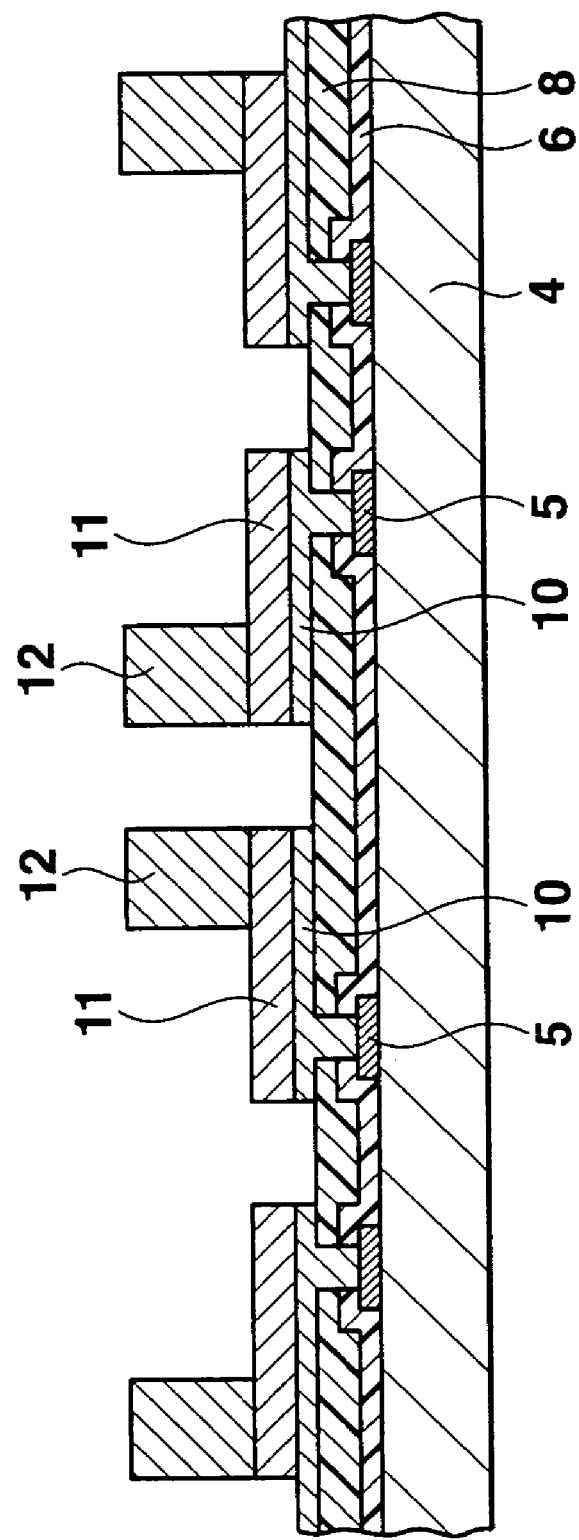
FIG. 5 is an enlarged sectional view showing a step following FIG. 4.

As shown in FIG. 4, a plating resist film 23 is formed and then patterned on the upper surface of the underlying metal layer 10 including the interconnections 11. In this case, the plating resist film 23 has an opening portion 24 at a position corresponding to the formation region of each columnar electrode 12. Copper electroplating is executed using the underlying metal layer 10 as a plating current path to form the columnar electrode 12 on the upper surface of the connection pad portion of the interconnection 11 in each opening portion 24 of the plating resist film 23. Then, the plating resist film 23 is removed. Unnecessary portions of the underlying metal layer 10 are removed by etching using the columnar electrodes 12 and interconnections 11 as a mask so that the underlying metal layers 10 are left only under the interconnections 11, as shown in FIG. 5.

Figure 6:
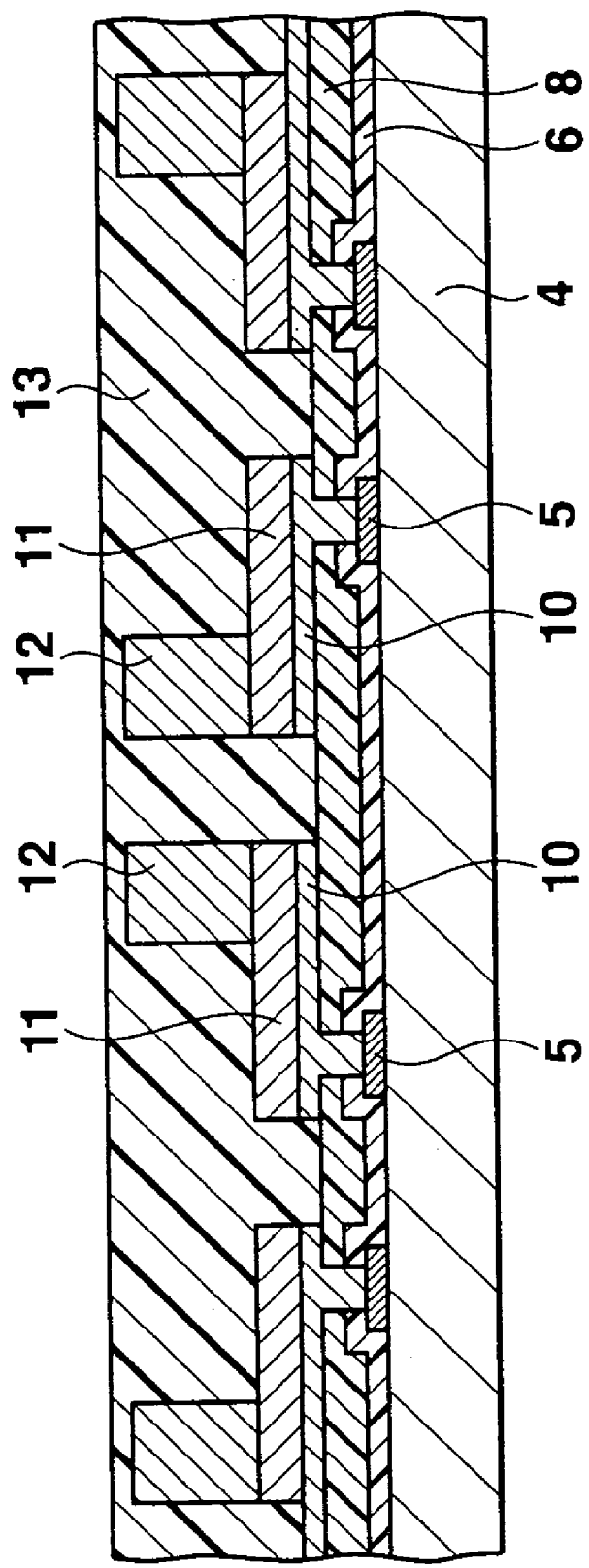
FIG. 6 is an enlarged sectional view showing a step following FIG. 5.

As shown in FIG. 6, a film of a thermosetting resin material such as epoxy resin or polyimide resin is formed on the entire upper surface of the protective film 8 including the columnar electrodes 12 and interconnections 11 by screen printing, spin coating, or die coating such that the film thickness of the thermosetting resin material is greater than the height of the columnar electrodes 12. The thermosetting resin material is set by heating to form the sealing film 13. Hence, in this state, the upper surfaces of the columnar electrodes 12 are covered with the sealing film 13.

Figure 7:
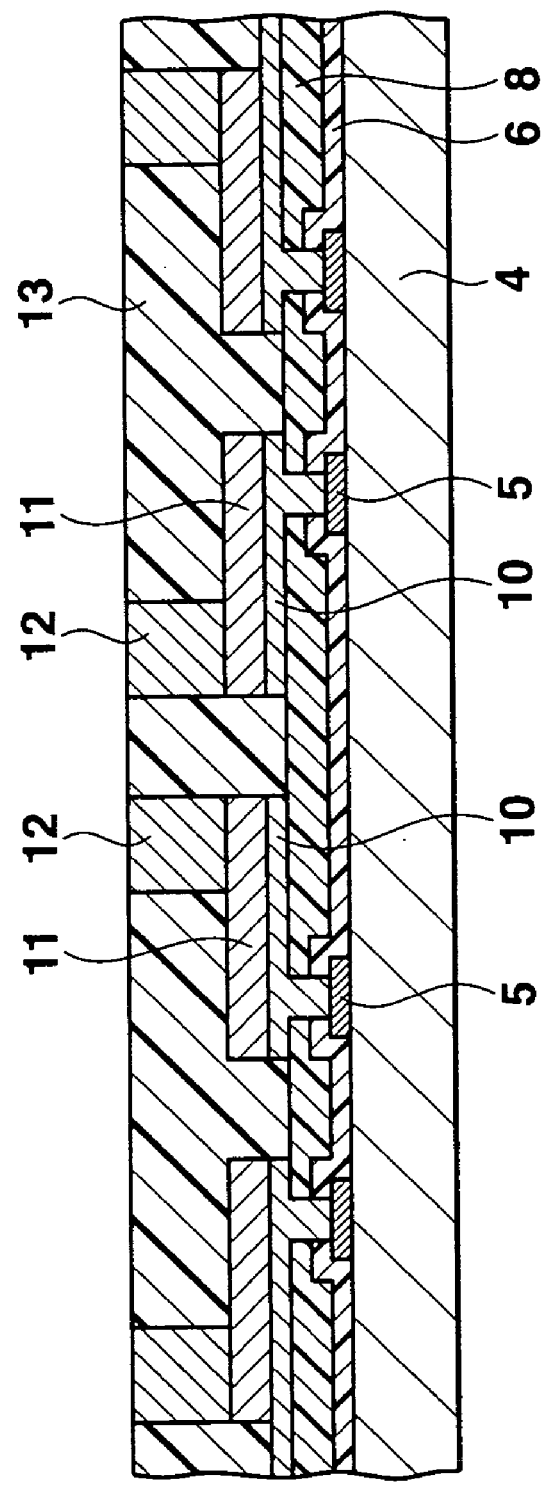
FIG. 7 is an enlarged sectional view showing a step following FIG. 6.

The upper surface side of the sealing film 13 and columnar electrodes 12 is polished to expose the upper surfaces of the columnar electrodes 12, as shown in FIG. 7. The upper surface of the sealing film 13 including the exposed upper surfaces of the columnar electrodes 12 is also planarized. The reason why the upper surface side of the columnar electrodes 12 is appropriately polished is that the heights of the columnar electrodes 12 formed by electroplating have a variation and need to be made uniform.

Figure 8:
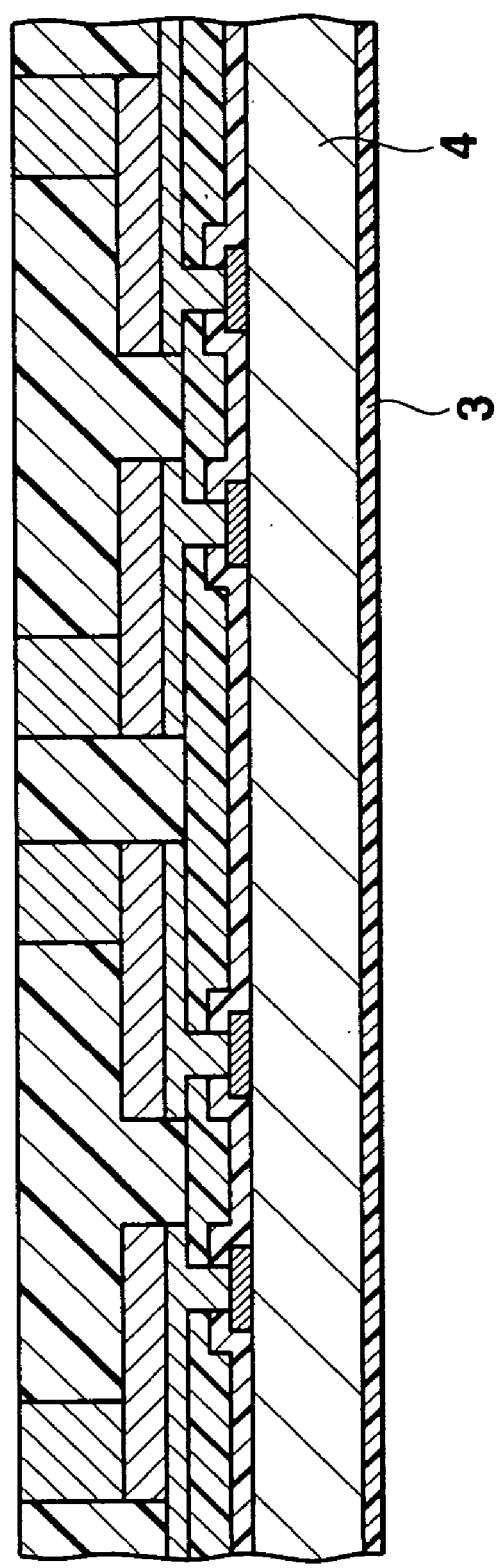
FIG. 8 is an enlarged sectional view showing a step following FIG. 7.
Figure 9:
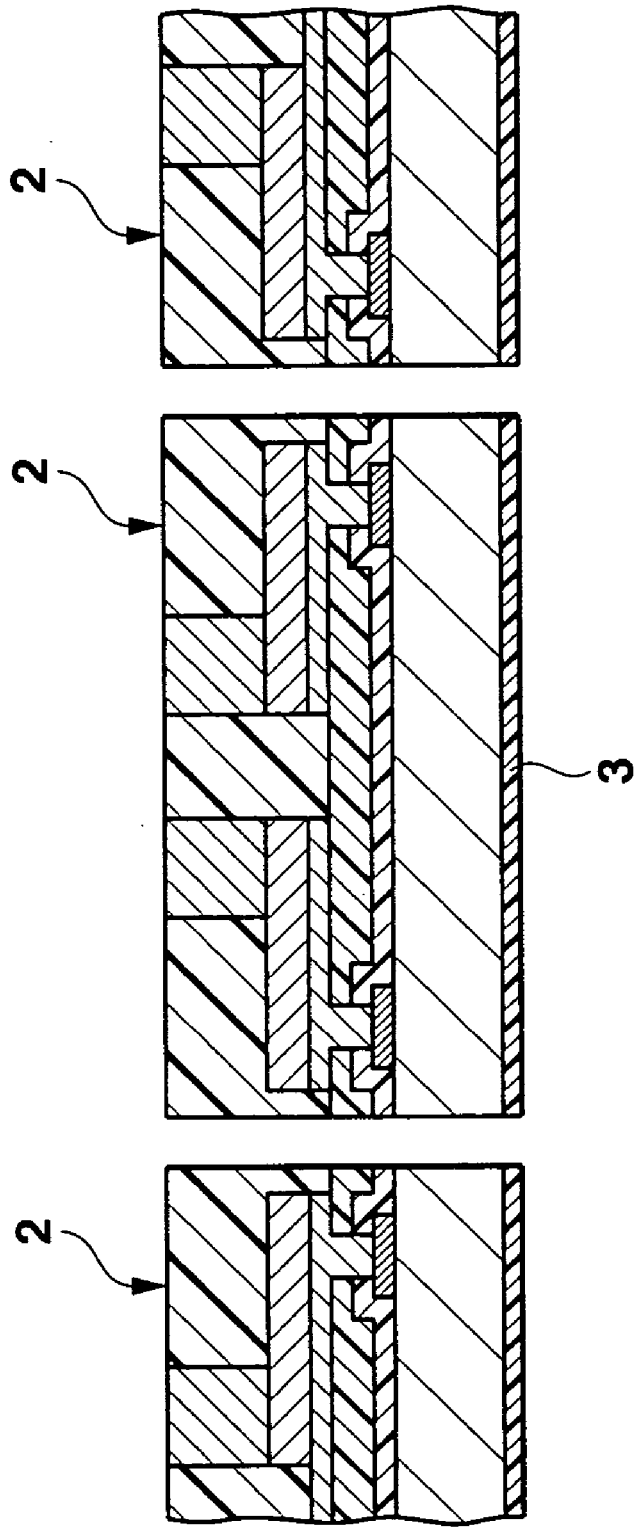
FIG. 9 is an enlarged sectional view showing a step following FIG. 8.

As shown in FIG. 8, the adhesive layer 3 is bonded to the entire lower surface of the silicon substrate 4. The adhesive layer 3 is made of a die bonding material such as epoxy resin or polyimide resin and sticks to the silicon substrate 4 in a semi-set state by heating and pressing. Next, the adhesive layer 3 sticking to the silicon substrate 4 is bonded to a dicing tape (not shown). After a dicing step shown in FIG. 9, the respective structures are peeled from the dicing tape. Accordingly, a plurality of semiconductor constructing bodies 2 each having the adhesive layer 3 on the lower surface of the silicon substrate 4, as shown in FIG. 1, are obtained.

In the semiconductor constructing body 2 thus obtained, the adhesive layer 3 exists on the lower surface of the silicon substrate 4. Hence, the very cumbersome operation for forming an adhesive layer on the lower surface of the silicon substrate 4 of each semiconductor constructing body 2 after the dicing step is unnecessary. The operation for peeling each semiconductor constructing body from the dicing tape after the dicing step is much simpler than the operation for forming an adhesive layer on the lower surface of the silicon substrate 4 of each semiconductor constructing body 2 after the dicing step.

Figure 10:
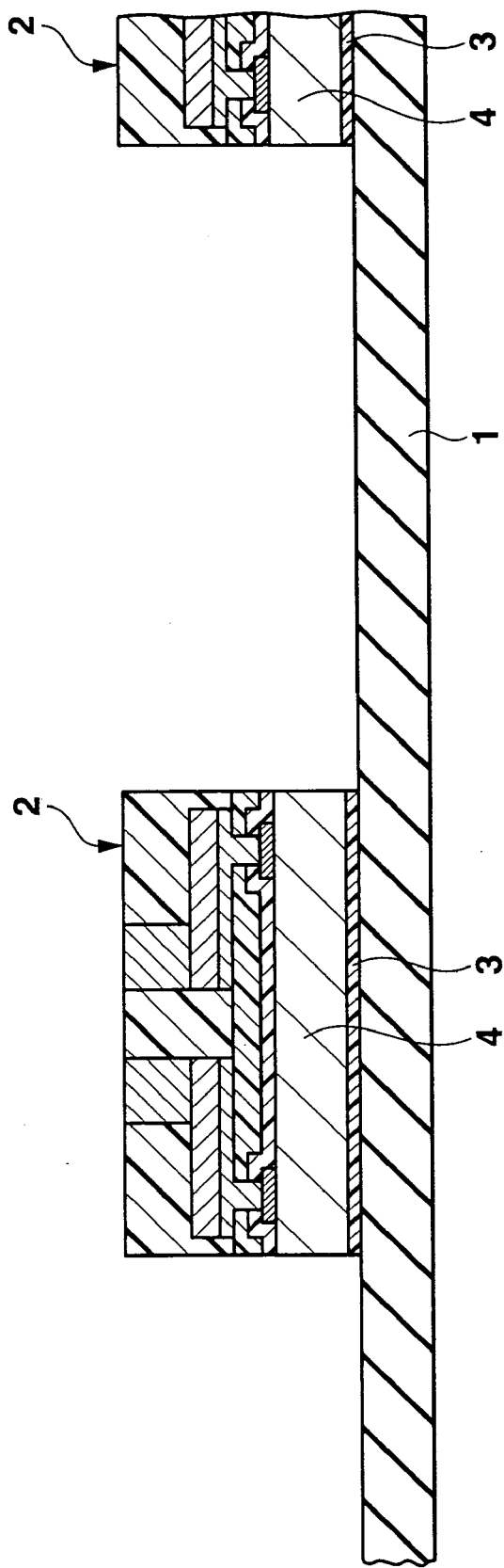
FIG. 10 is an enlarged sectional view showing a step following FIG. 9.

An example will be described next, in which the semiconductor package shown in FIG. 1 is manufactured using the semiconductor constructing body 2 obtained in the above way. First, as shown in FIG. 10, the base plate 1 is prepared. The base plate (large plate) 1 is large enough to enable a plurality of base plates (small plates) 1 shown in FIG. 1 can be sampled. The base plate 1 has a rectangular planar shape, though this shape is not limited. Next, the adhesive layers 3 bonded to the lower surfaces of the silicon substrates 4 of the semiconductor constructing bodies 2 are bonded to a plurality of predetermined portions of the upper surface of the base plate (large plate) 1. In this bonding process, the adhesive layer 3 is finally set by heating and pressing.

Figure 11:
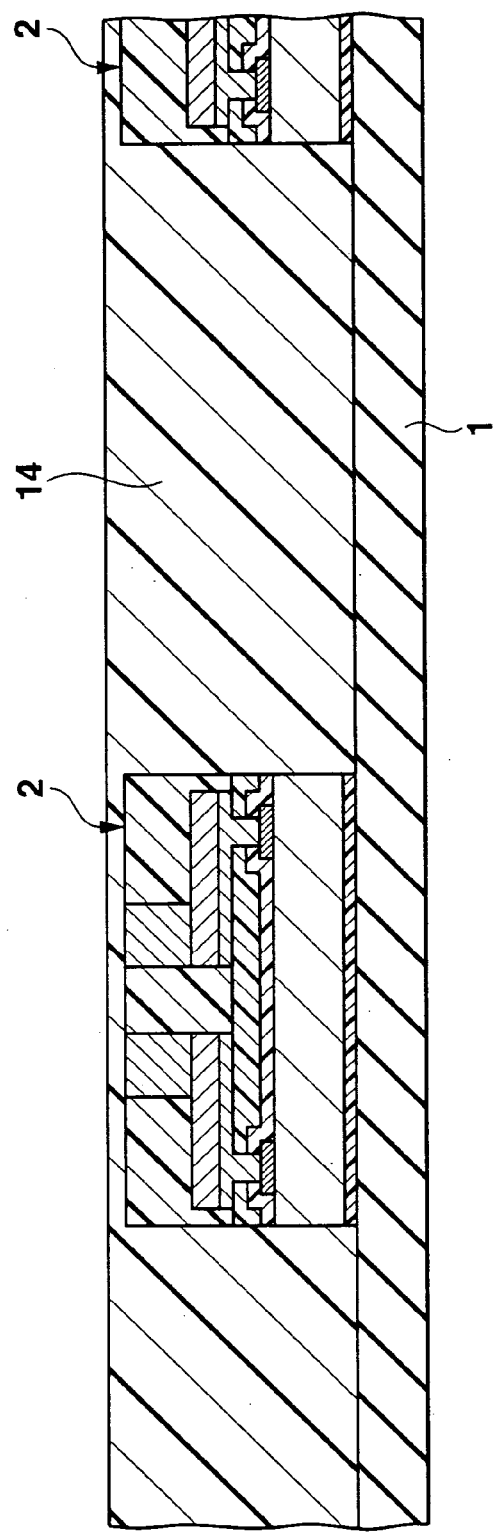
FIG. 11 is an enlarged sectional view showing a step following FIG. 10.

As shown in FIG. 11, the insulating layer 14 made of a thermosetting resin material such as epoxy resin or polyimide resin is formed on the entire upper surface of base plate 1 including the semiconductor constructing bodies 2 by screen printing, spin coating, or die coating such that the thickness of the insulating layer 14 is greater than the height of the semiconductor constructing bodies 2. The thermosetting resin material is set by heating. Hence, in this state, the upper surfaces of the semiconductor constructing bodies 2 are covered with the insulating layer 14.

Figure 12:
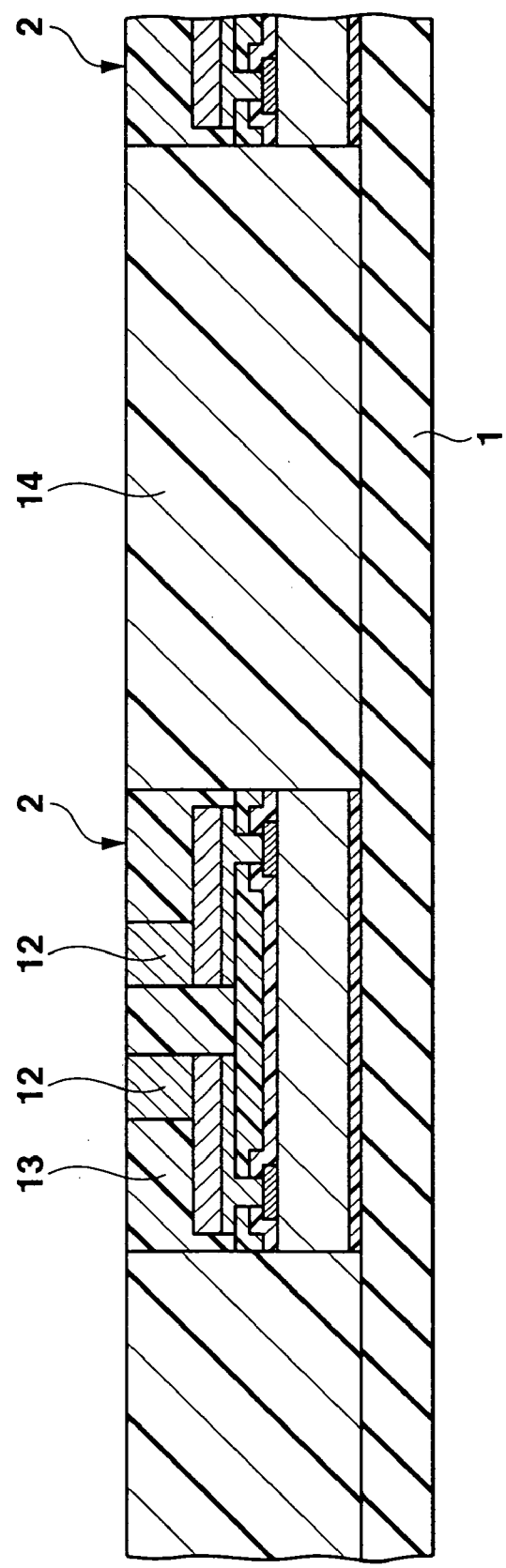
FIG. 12 is an enlarged sectional view showing a step following FIG. 11.

Next, at least the upper surface side of the insulating layer 14 is appropriately polished to expose the upper surfaces of the columnar electrodes 12, as shown in FIG. 12. The upper surface of the sealing film 13 (i.e., the upper surfaces of the semiconductor constructing bodies 2) including the exposed upper surfaces of the columnar electrodes 12 and the upper surface of the insulating layer 14 are also planarized.

Figure 13:
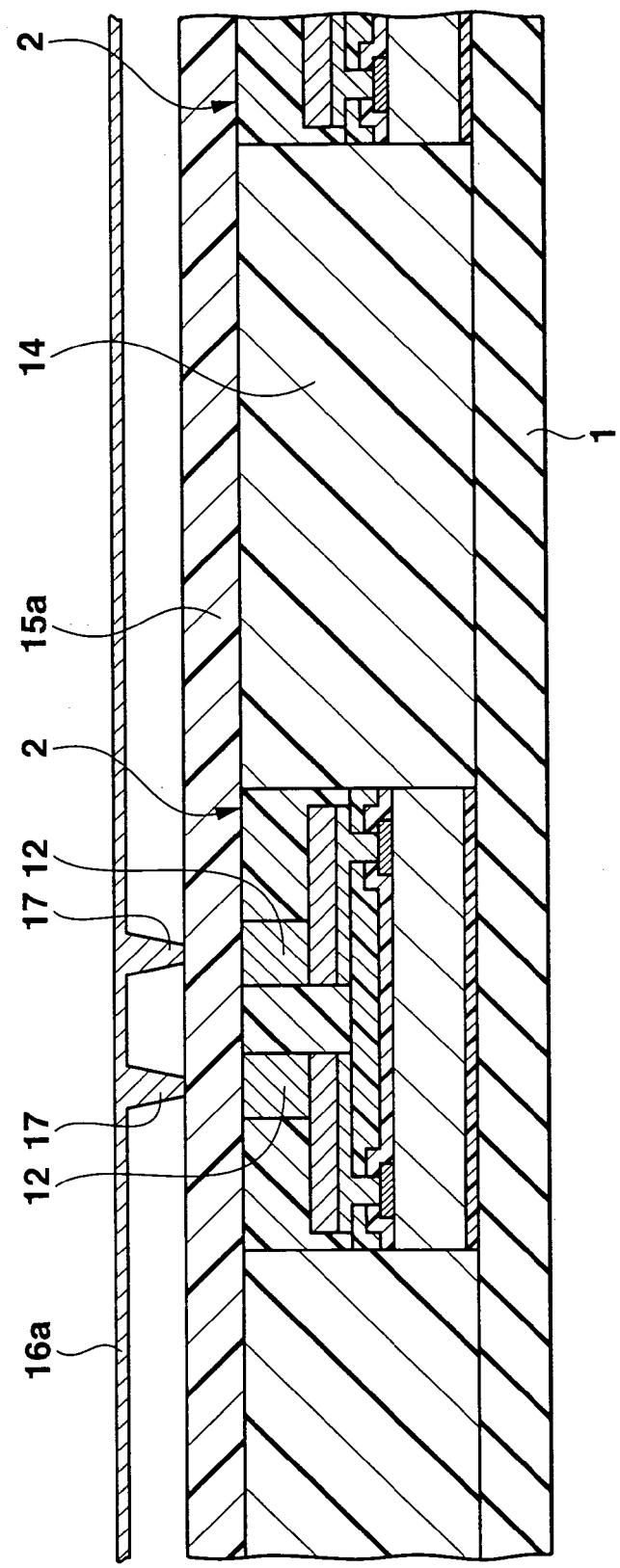
FIG. 13 is an enlarged sectional view showing a step following FIG. 12.

As shown in FIG. 13, a sheet-shaped insulating material 15a is mounted on the upper surfaces of the semiconductor constructing bodies 2 and insulating layer 14. In this case, the insulating material 15a is preferably a prepreg material. The prepreg material is prepared by impregnating fibers made of an inorganic material such as glass and semi-setting the thermosetting resin material with a thermosetting resin material such as epoxy resin. To obtain flatness, the insulating material 15a preferably has a sheet shape. However, the insulating material 15a need not always be a prepreg material and may be formed from only a thermosetting resin material containing no fiber.

A metal plate 16a is aligned to and arranged on the upper surface of the insulating material 15a. The metal plate 16a has, on its lower surface, the projecting electrodes 17 with a truncated conical shape formed at least at positions corresponding to the columnar electrodes 12. More specifically, the metal plate 16a is arranged on the upper surface of the insulating material 15a such that the distal end portion of each projecting electrode 17 is located on the central portion of the upper surface of a corresponding columnar electrode 12. In this case, the upper surface of the metal plate 16a is chucked by a thermocompression bonding plate with a vacuum chuck mechanism (not shown). Then, the metal plate 16a is aligned by moving the thermocompression bonding plate in the X, Y, and Z directions (and in the θ direction as needed). A method of forming the metal plate 16a having the projecting electrodes 17 will be described later.

Figure 14:
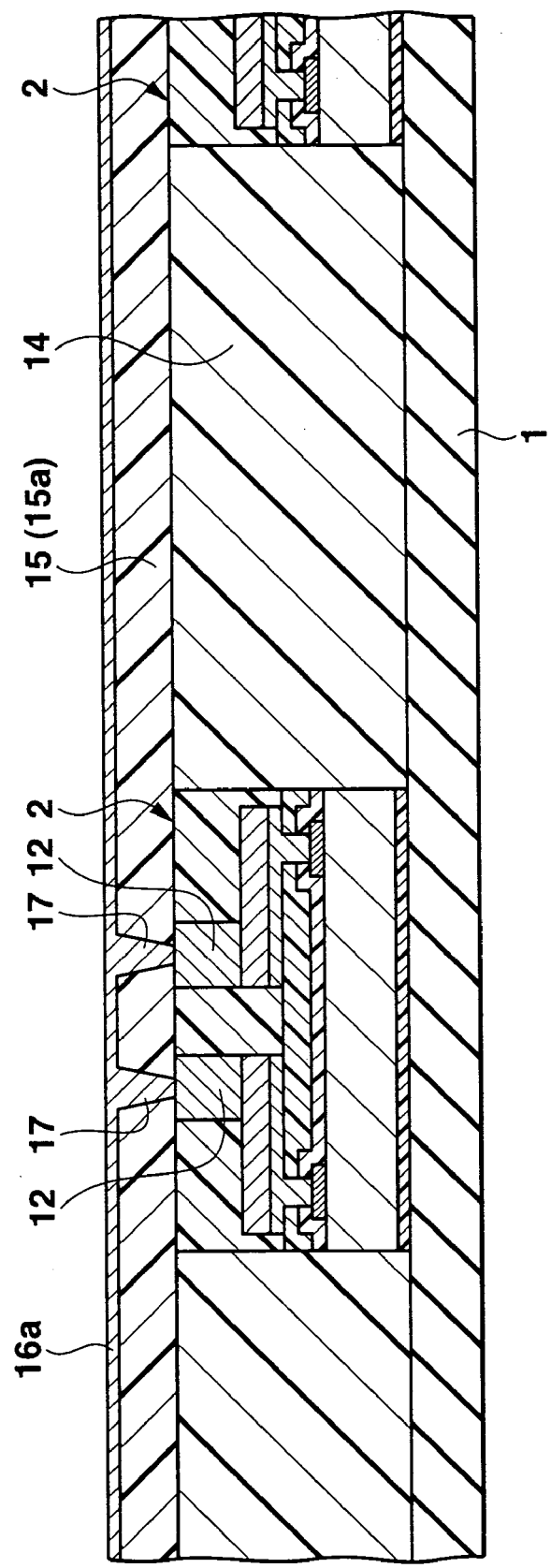
FIG. 14 is an enlarged sectional view showing a step following FIG. 13.

When the metal plate 16a is heated and pressed by the thermocompression bonding plate with a vacuum chuck mechanism, and projecting electrodes 17 having the truncated conical shape enter the insulating material 15a. The projecting electrodes 17 cut into or penetrate through the insulating material 15a. In addition, the lower surface of the metal plate 16a slightly cuts into the insulating material 15a from its upper surface. In this state, the lower ends of the projecting electrodes 17 abut against the central portions of the upper surfaces of the columnar electrodes 12. At this time, the insulating material 15a is heated through the metal plate 16a to finally set the thermosetting resin material in the insulating material 15a. With this process, as shown in FIG. 14, the projecting electrodes 17 of the metal plate 16a cut from the upper surface side to the lower surface side of the insulating material 15a in the entire direction of its thickness and the insulating material 15a is set in a state wherein the lower surface of the metal plate 16a is in tight contact with the upper surface of the insulating material 15a. For these reasons, the bonding strength between the metal plate 16a and the insulating material 15a increases. Accordingly, the reliability of electrical connection between the columnar electrodes 12 and the projecting electrodes 17 of the metal plate 16a increases.

Figure 15:
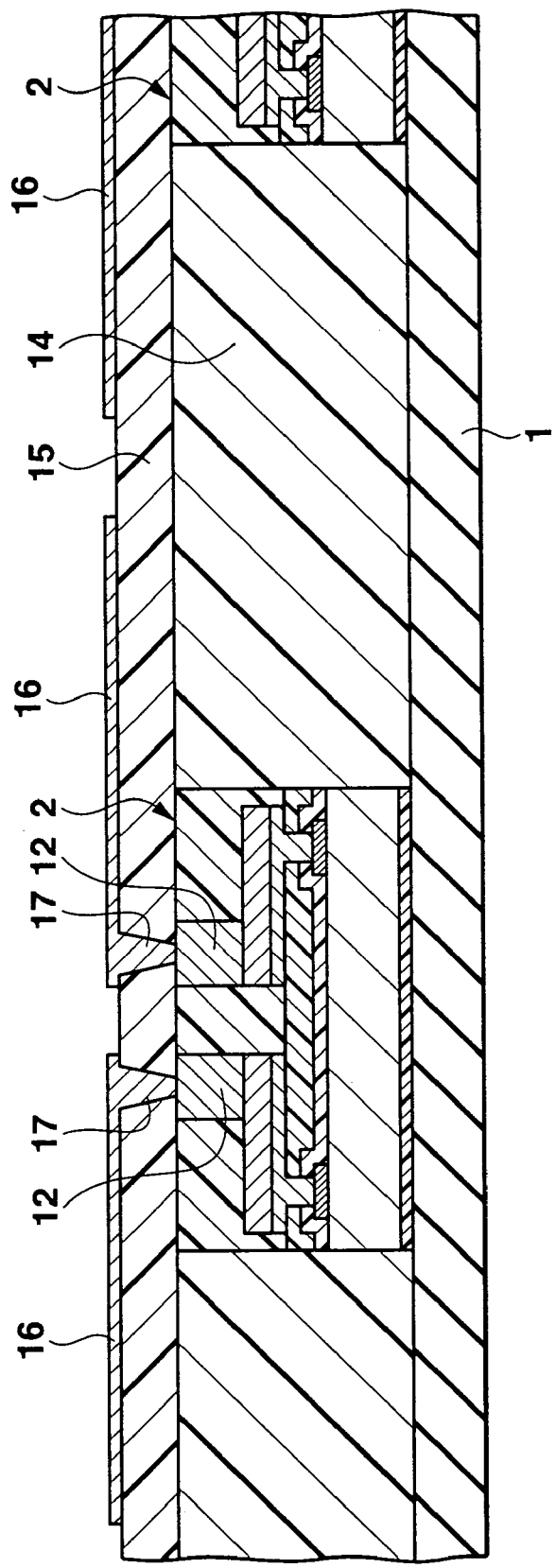
FIG. 15 is an enlarged sectional view showing a step following FIG. 14.

Next, the metal plate 16a is patterned by photolithography, so that the upper interconnections 16 are formed on the upper surface of the insulating film 15, as shown in FIG. 15. As described above, in this state, the upper interconnections 16 are reliably electrically connected to the upper surfaces of the columnar electrodes 12 through the projecting electrodes 17 which cut into the insulating film 15.

Figure 16:
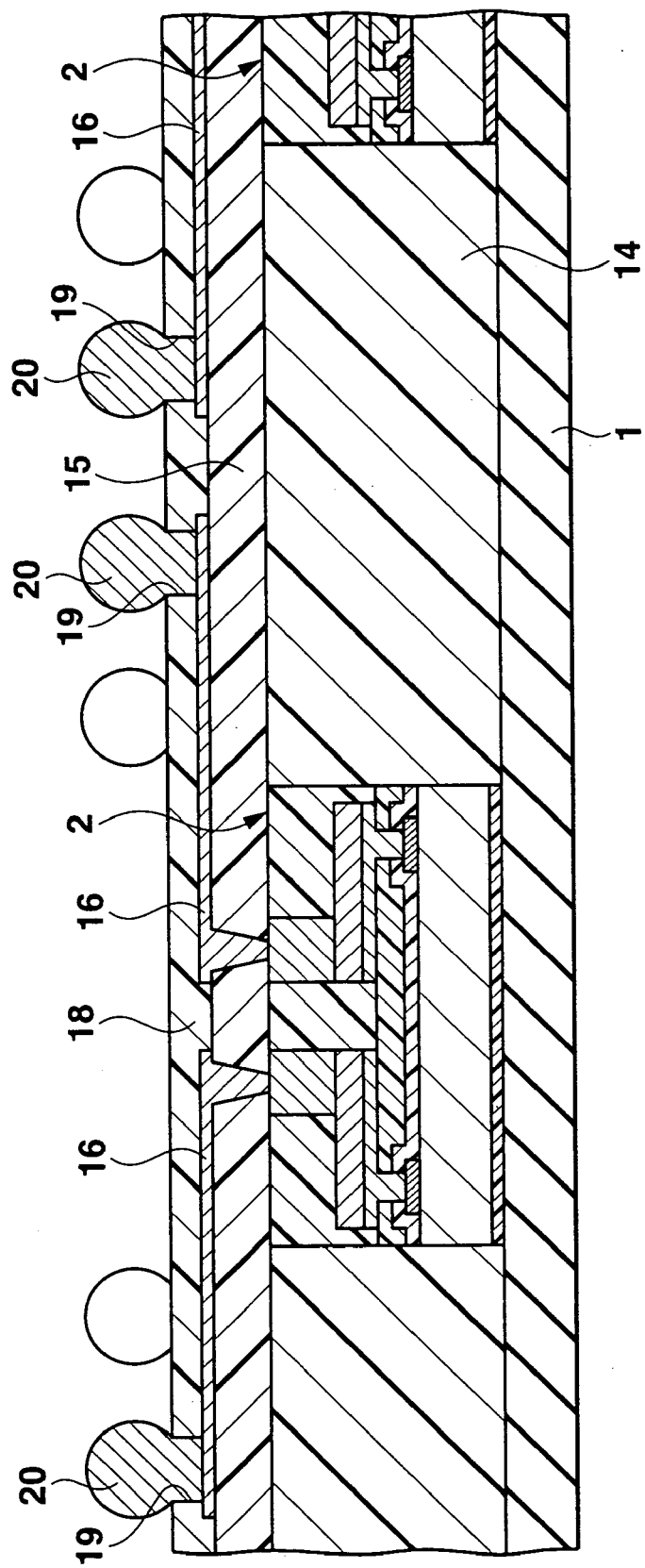
FIG. 16 is an enlarged sectional view showing a step following FIG. 15.

As shown in FIG. 16, the upper insulating film 18 made of a solder resist is formed on the entire upper surface of the insulating film 15 including the upper interconnections 16 by screen printing or spin coating. In this case, the upper insulating film 18 has the opening portions 19 at positions corresponding to the connection pad portions of the upper interconnections 16. Next, the solder balls 20 are formed in and on the opening portions 19 and connected to the connection pad portions or end portions of the upper interconnections 16 at their lower ends.

Figure 17:
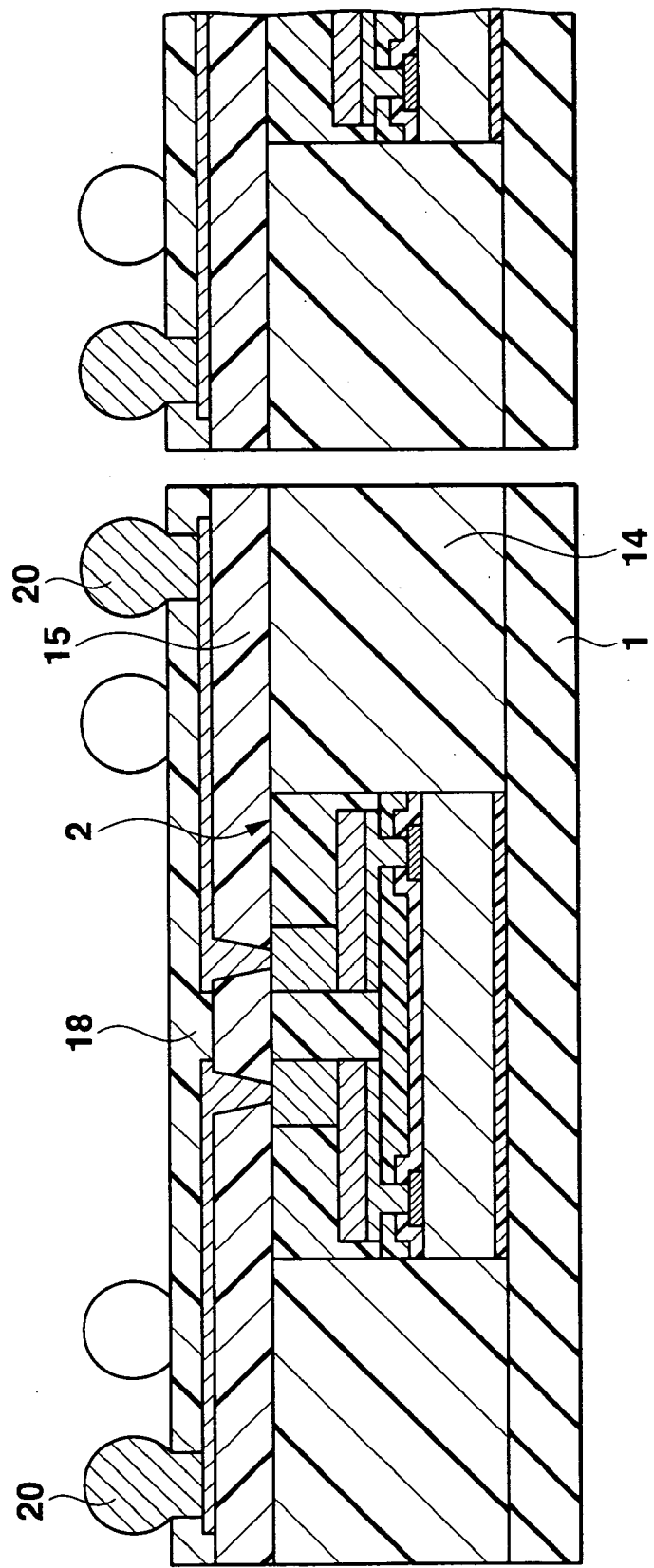
FIG. 17 is a sectional view showing a step following FIG. 16.

As shown in FIG. 17, when the upper insulating film 18, insulating film 15, insulating layer 14, and base plate 1 are cut between the adjacent semiconductor constructing bodies 2, a plurality of semiconductor packages shown in FIG. 1 are obtained.

As described above, in the manufacturing method, the projecting electrodes 17 formed on the metal plate 16a are made to cut into the insulating film 15 and electrically connected to the columnar electrodes 12 of the semiconductor constructing bodies 2. After that, the metal plate 16a is patterned to from the upper interconnections 16. Hence, no opening portions for interlayer connection need be previously formed in the insulating film 15. In addition, since no electroplating is executed, no underlying metal layer need be formed, and its unnecessary portions need not be removed. For these reasons, the number of steps decreases, and the productivity can be increased.

Furthermore, the upper surface of the insulating film 15 is flat. For this reason, the height positions of the upper surfaces of the upper interconnections 16 and solder balls 20, which are formed in subsequent steps, can be made uniform, and the reliability of bonding can be increased. In addition, the thicknesses of the upper interconnections 16 formed by patterning a metal plate can be uniformed, and any step difference between the upper interconnections 16 can be prevented.

The plurality of semiconductor constructing bodies 2 are arranged on the base plate or common plate 1 via the adhesive layer 3. The insulating layer 14, insulating film 15, upper interconnections 16, upper insulating film 18, and solder balls 20 are formed simultaneously for the plurality of semiconductor constructing bodies 2. Then, the structures are separated to obtain a plurality of semiconductor packages. Hence, the manufacturing step can be simplified. From the manufacturing step shown in FIG. 12, the plurality of semiconductor constructing bodies 2 can be transported together with the base plate 1. This also simplifies the manufacturing step.

Figure 18:
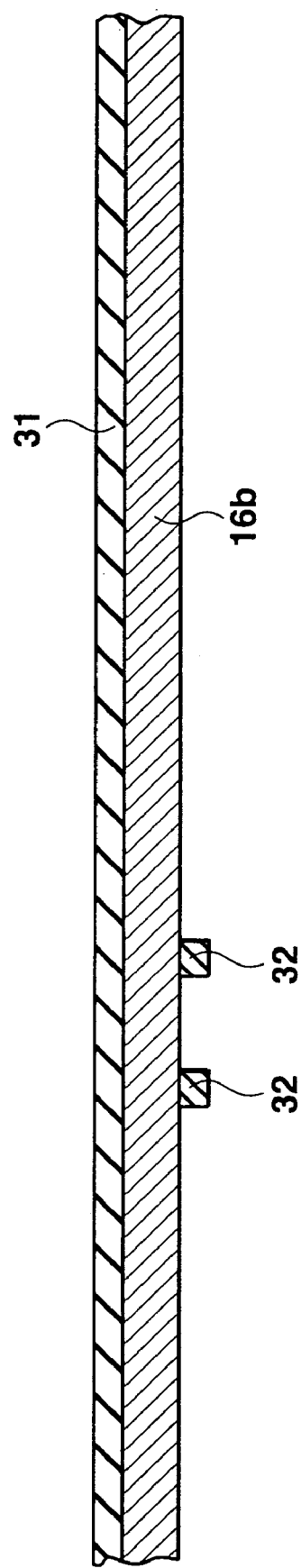
FIG. 18 is an enlarged sectional view showing an initial step in forming a copper plate having a projecting electrode.
Figure 19:
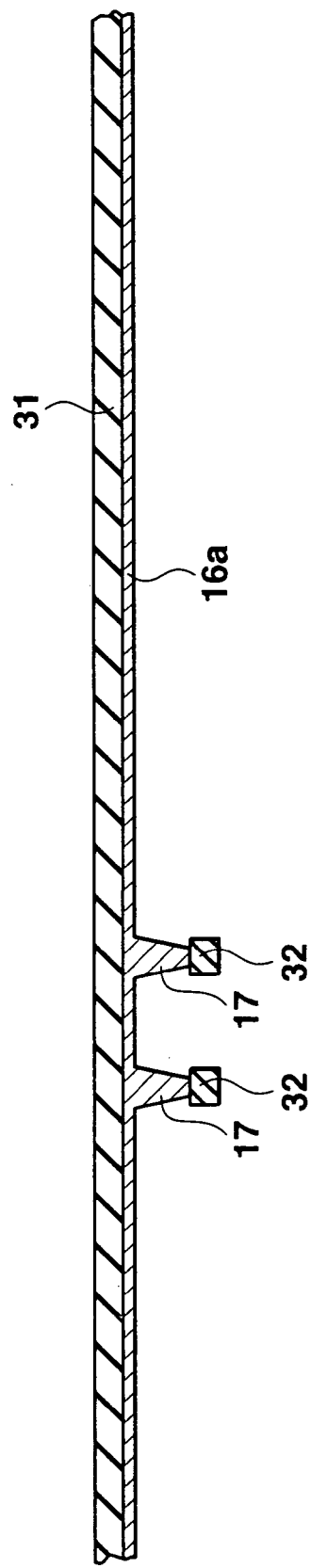
FIG. 19 is an enlarged sectional view showing a step following FIG. 18.
Figure 20:
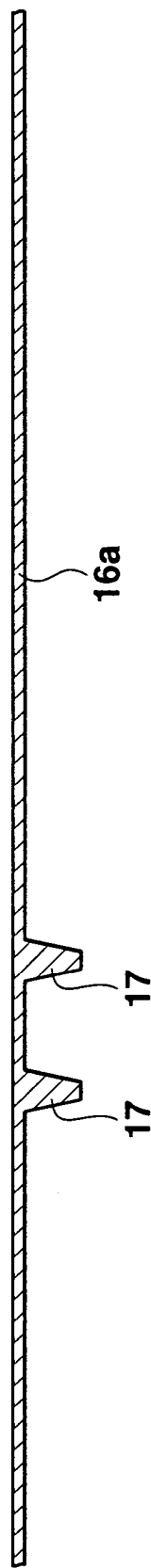
FIG. 20 is an enlarged sectional view showing a step following FIG. 19.

A method of forming the metal plate 16a having the projecting electrodes 17 will be described next. First, as shown in FIG. 18, an upper resist film 31 is formed on the entire upper surface of a metal plate 16b having a uniform thickness. In addition, lower resist films 32 each having a circular planar shape are formed at predetermined portions (i.e., the formation regions of the projecting electrodes 17) on the lower surface of the metal plate. As shown in FIG. 19, half wet etching is executed from the under side of the thick metal plate. Thus, since the etching progresses isotropically, the thin metal plate 16a is formed in a region where the lower resist films 32 are not present. Consequently, the projecting electrodes 17 having a truncated conical shape are formed in the regions where the lower resist films 32 are present on the lower surface of the thin metal plate 16a. The resist films 31 and 32 are removed, so that the metal plate 16a having the projecting electrodes 17 is obtained.

An example of the dimensions of the thin metal plate 16a having the projecting electrodes 17 will be described next. Assume that the thickness of the thick metal plate 16b in the initial state is about 100 µm, and the height of the projecting electrodes 17 is about 80 µm. Then, the thickness of the thin metal plate 16a having the projecting electrodes 17 is about 20 µm. The diameter of the projecting electrodes 17 is about 50 µm at the proximal portion and about 20 µm at the distal or lower end portion.

In this case, a prepreg material of, e.g., grade FR-4, which is prepared by impregnating glass fibers with epoxy resin, is used as the insulating material 15a shown in FIG. 13, and the thickness of the prepreg material is set to about 80 µm in correspondence with the height of the projecting electrodes 17. Then, the projecting electrodes 17 can satisfactorily be made to cut into the insulating material 15a within the heating temperature range of 95° C. to 115° C.

As another method of forming the projecting electrodes 17, a conductive paste made of, e.g., silver paste may be printed on one surface of a thin metal plate and hardened to form the projecting electrodes 17. In either method, the thickness of the metal plate (the thickness of the interconnection portion) is preferably about 10 to 50 µm. The height of the projecting electrodes 17 (the height projecting from the lower surface of the metal plate) is preferably about 20 to 150 µm. The diameter of the projecting electrodes 17 is preferably about 50 to 400 µm at the proximal portion and about 10 to 200 µm at the distal end portion (the diameter at the distal end portion is set to be smaller than that at the proximal portion), although the diameters are not limited to the above values.

In the above method, the thickness of the insulating material 15a is set to be equal to or slightly smaller than the height of the projecting electrodes 17. The metal plate 16a need not always include a single copper layer. The metal plate 16a may have a two-layered structure including a base plate made of, e.g., nickel and a projecting electrode formation plate made of, e.g., copper.

In the above embodiment, the solder balls 20 are arrayed in a matrix in correspondence with the entire surface of the semiconductor constructing body 2 and the insulating layer 14 around it. However, the solder balls 20 may be formed only on a region corresponding to the upper surface of the insulating layer 14 around the semiconductor constructing body 2. In this case, the solder balls 20 may be formed not totally around the semiconductor constructing body 2 but on only one to three sides of the four sides of the semiconductor constructing body 2. In this case, the insulating layer 14 need not have a rectangular frame shape and may be arranged on only a side where the solder balls 20 are to be formed.

(Modification)

Figure 21:
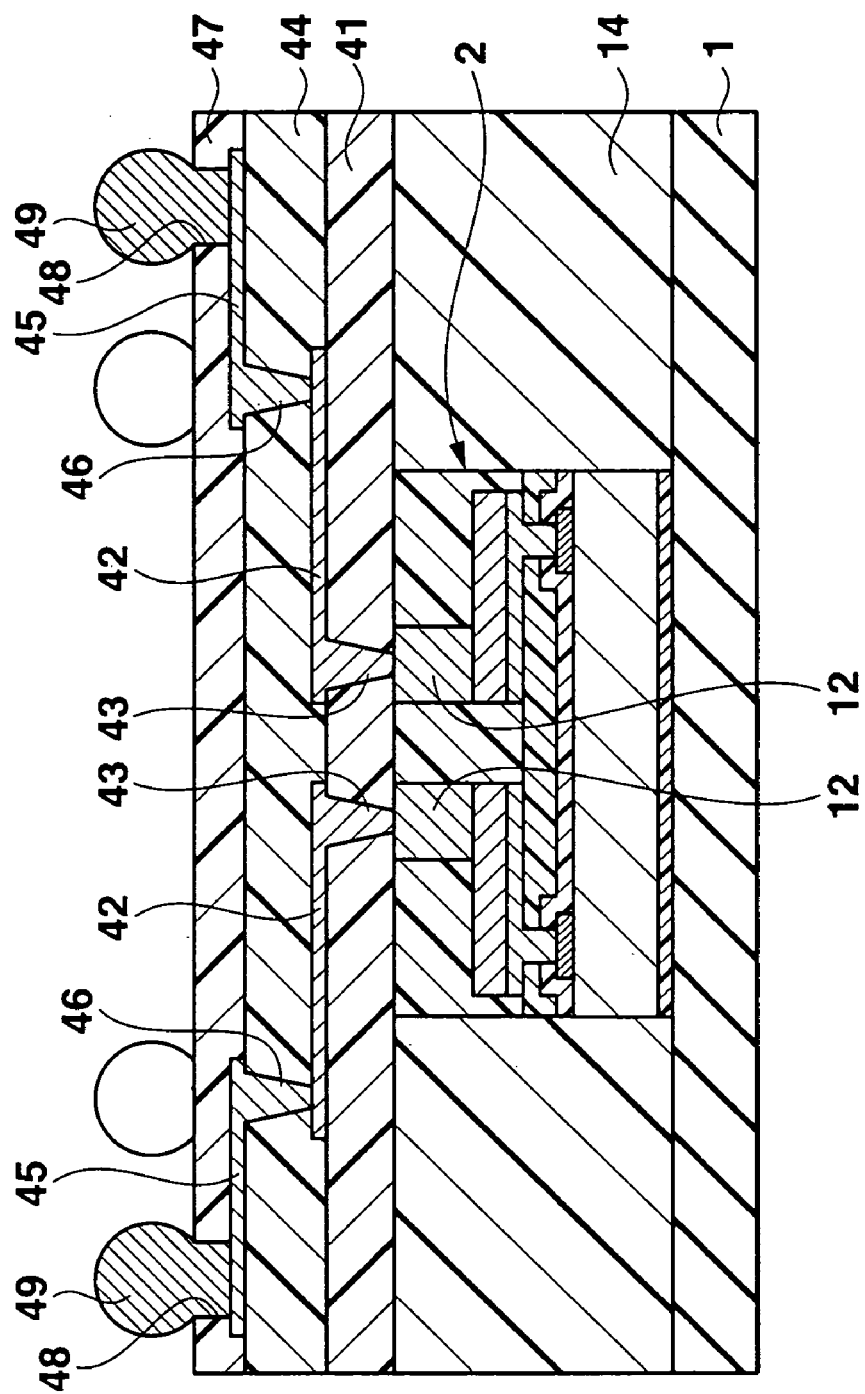
FIG. 21 is an enlarged sectional view of a semiconductor package as a modification of the present invention.

In the above-described embodiment, for example, as shown in FIG. 1, the upper interconnections 16 and the upper insulating film 18, each of which includes one layer, are formed on the insulating film 15. However, the present invention is not limited to this. The upper interconnections 16 and upper insulating film 18 each including two or more layers may be formed. For example, as in the modification shown in FIG. 21, each of the upper interconnections and upper insulating film may have two layers.

More specifically, a first upper insulating film 41 made of a prepreg material is formed on the upper surfaces of the semiconductor constructing body 2 and insulating layer 14. First upper interconnections 42 are formed on the upper surface of the first upper insulating film 41 and electrically connected to the upper surfaces of the columnar electrodes 12 through projecting electrodes 43 cutting into the first upper insulating film 41. A second upper insulating film 44 made of a prepreg material is formed on the upper surface of the first upper insulating film 41 including the first upper interconnections 42. Second upper interconnections 45 are formed on the upper surface of the second upper insulating film 44 and electrically connected to the upper surfaces of the connection pad portions of the first upper interconnections 42 through projecting electrodes 46 cutting into the second upper insulating film 44.

A third upper insulating film 47 made of a solder resist is formed on the upper surface of the second upper insulating film 44 including the second upper interconnections 45. The third upper insulating film 47 has opening portions 48 at positions corresponding to the connection pad portions of the second upper interconnections 45. Solder balls 49 are formed in and on the opening portions 48 and electrically connected to the connection pad portions of the second upper interconnections 45 at their lower ends.

(Another Modification)

Figure 22:
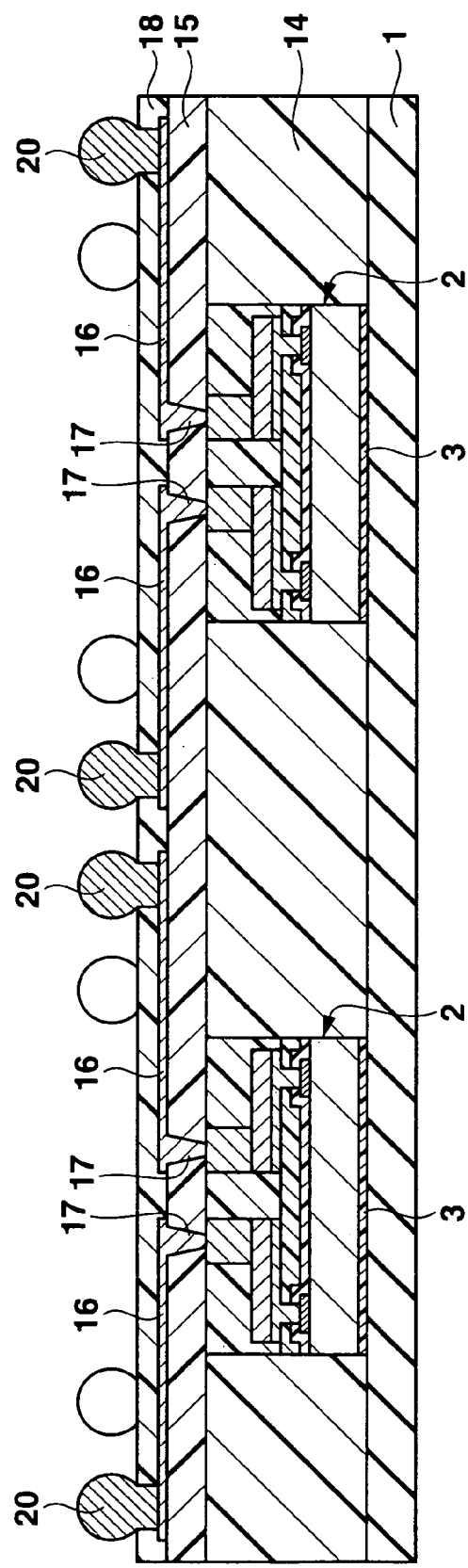
FIG. 22 is an enlarged sectional view of a semiconductor package as another modification of the present invention.

In the example shown in FIG. 17, the resultant structure is cut between the semiconductor constructing bodies 2 adjacent to each other. However, the present invention is not limited to this. The resultant structure may be cut for a plurality of assemblies each having two or more semiconductor constructing bodies 2. For example, as in another modification shown in FIG. 22, the resultant structure may be cut for every two semiconductor constructing bodies 2 to obtain a multi-chip module type semiconductor package. In this case, the two semiconductor constructing bodies 2 can be either of the same type or of different types.

(Other Embodiments)

In the above-described embodiment, the semiconductor constructing body 2 has not only the connection pads 5 but also the interconnections 11 and columnar electrodes 12 as external connection electrodes. The present invention can be applied to the semiconductor constructing body 2 having only the connection pads 5 as external connection electrodes or the semiconductor constructing body 2 having the connection pads 5 and the interconnections 11 with connection pad portions.

As described above, according to the present invention, projecting electrodes are formed on interconnections made of a metal plate. The projecting electrodes are made to cut into the insulating film formed on external connection electrodes. In this state, the projecting electrodes are connected to the external connection electrodes. Hence, the bonding strength between the projecting electrodes and the insulating film increases. Accordingly, the reliability of electrical connection between the interconnections and the external connection electrodes increases.

What is claimed is:
1. A semiconductor package comprising:
 at least one semiconductor constructing body comprising a semiconductor substrate and a plurality of external connection electrodes provided on the semiconductor substrate;
 an insulating film which covers the semiconductor constructing body; and a plurality of interconnections formed on the insulating film, wherein each of the interconnections comprises a substantially flat body extending on the insulating film, and a projecting electrode;

wherein each of the projecting electrodes cuts through the insulating film at a portion corresponding to one of the external connection electrodes and is electrically connected to said one of the external connection electrodes, and gradually narrows from the flat body toward said one of the external connection electrodes.

2. The semiconductor package according to claim 1, wherein the semiconductor package comprises a plurality of semiconductor constructing bodies.

3. The semiconductor package according to claim 1, wherein the external connection electrodes comprise columnar electrodes, and the semiconductor constructing body further comprises connection pads that are respectively connected to the columnar electrodes, and a sealing film which is formed around the columnar electrodes.

4. The semiconductor package according to claim 3, wherein the semiconductor constructing body further comprises a plurality of interconnections which respectively electrically connect the connection pads to the columnar electrodes.

5. The semiconductor package according to claim 1, wherein the insulating film comprises a sheet.

6. The semiconductor package according to claim 5, wherein the sheet has a flat upper surface.

7. The semiconductor package according to claim 1, wherein each of the projecting electrodes is integrally formed with the corresponding flat body.

8. The semiconductor package according to claim 1, wherein each of the projecting electrodes is formed essentially from a metal paste sticking to the corresponding flat body.

9. The semiconductor package according to claim 1, wherein each of the projecting electrodes has a truncated conical shape.

10. The semiconductor package according to claim 1, wherein each of the interconnections comprises a connection pad portion, and the semiconductor package further comprises an upper insulating film that is formed above the interconnections and exposes each said connection pad portion.

11. The semiconductor package according to claim 1, further comprising:
at least one upper insulating film on the insulating film and the interconnections; and
at least one upper interconnection which is formed on the upper insulating film and electrically connected to a connection pad portion of one of the lower connections below the upper insulating film.

12. The semiconductor package according to claim 11, further comprising another upper insulating film that is formed above the at least one upper interconnection and exposes a connection pad portion of the upper interconnection.

13. The semiconductor package according to claim 11, wherein the upper interconnection comprises an upper projecting electrode, and the upper projecting electrode cuts through the upper insulating film to be electrically connected to the connection pad portion of the one of the lower interconnections.

14. The semiconductor package according to claim 11, wherein a solder ball is formed on a connection pad portion of the upper interconnection.

15. The semiconductor package according to claim 1, further comprising an insulating layer formed on an outer side surface of the semiconductor constructing body.

16. The semiconductor package according to claim 15, further comprising a base plate arranged on lower surfaces of the semiconductor constructing body and the insulating layer.

17. A method of manufacturing the semiconductor package of claim 1, said method comprising: covering, with the insulating film, an upper surface of at least one semiconductor constructing body;

arranging, on the insulating film, a metal plate including the projecting electrodes corresponding to the external connection electrodes;

making the projecting electrodes of the metal plate cut through the insulating film and electrically connecting the projecting electrodes to the external connection electrodes; and forming the interconnections to each include one of the projecting electrodes, by patterning the metal plate.

18. The method according to claim 17, wherein the external connection electrodes comprise columnar electrodes, and the semiconductor constructing body further comprises connection pads that are respectively electrically connected to the columnar electrodes, and a sealing film which is formed around the columnar electrodes.

19. The method according to claim 18, wherein the semiconductor constructing body further comprises a plurality of interconnections which respectively electrically connect the connection pads to the columnar electrodes.

20. The method according to claim 17, wherein the insulating film comprises a sheet.

21. The method according to claim 20, wherein the sheet has a flat upper surface.

22. The method according to claim 17, wherein the projecting electrodes are made to cut through the insulating film in a semi-set state of the insulating film, and subsequently the projecting electrode is finally set, such that the metal plate is in tight contact with an upper surface of the insulating film.

23. The method according to claim 17, wherein the projecting electrodes are formed to be integrated with a lower surface of the metal plate and to have a truncated conical shape by executing half etching of the lower surface of the metal plate.

24. The method according to claim 17, wherein each of the projecting electrodes is formed to have a truncated conical shape by printing a metal paste on a lower surface of the metal plate.

25. The method according to claim 17, wherein upper surfaces of a plurality of semiconductor constructing bodies are covered with the insulating film, and the method further comprises, before covering the upper surfaces surfaces of the semiconductor constructing body bodies with the insulation film:

arranging the plurality of semiconductor constructing bodies while separating the semiconductor constructing bodies from each other; and forming an insulating layer on an outer side surface of the semiconductor constructing bodies;

wherein upper surfaces of the semiconductor constructing bodies and the insulating layer are then covered with the insulating film.

26. The method according to claim 25, further comprising, after forming the interconnections by patterning the metal plate, cutting the insulating film and the insulating layer between the semiconductor constructing bodies to obtain a plurality of separate said semiconductor packages each including at least one said semiconductor constructing body.

27. The method according to claim 26, wherein the cutting is performed so as to make each said semiconductor package include a plurality of the semiconductor constructing bodies.

28. The method according to claim 26, wherein a base plate is arranged on lower surfaces of the semiconductor constructing body and the insulating layer, and the cutting includes cutting the base plate such that each said semiconductor package includes a part of the base plate.

29. The method according to claim 17, further comprising, after forming the interconnections, forming at least one upper insulating film on the insulating film and the interconnections, and forming upper interconnections on the upper insulating film that are connected to connection pad portions of the lower interconnections below the upper insulating film.

30. The method according to claim 29, further comprising forming another upper insulating film above the upper interconnections that exposes connection pad portions of the upper interconnections.

31. The method according to claim 29, wherein each said upper interconnection comprises another projecting electrode, and the method further comprises:

making each said another projecting electrode cut through the upper insulating film; and electrically connecting the another projecting electrodes to the connection pad portions of the lower interconnections.

32. The method according to claim 29, further comprising forming a solder ball on a connection pad portion of each of the upper interconnections.

* * * * *